(12) United States Patent
Wattier et al.

(10) Patent No.: US 12,402,275 B2
(45) Date of Patent: Aug. 26, 2025

(54) UNIVERSAL RUGGEDIZED COMPUTER SYSTEM ENCLOSURE

(71) Applicant: United States of America as Represented by The Secretary of the Army, Alexandria, VA (US)

(72) Inventors: Joshua D Wattier, Champaign, IL (US); Nathaniel J Bidner, Champaign, IL (US)

(73) Assignee: UNITED STATES OF AMERICA AS REPRESENTED BY THE SECRETARY OF THE ARMY, Alexandria, VA (US)

( * ) Notice: Subject to any disclaimer, the term of this patent is extended or adjusted under 35 U.S.C. 154(b) by 159 days.

(21) Appl. No.: 17/957,230

(22) Filed: Sep. 30, 2022

(65) Prior Publication Data

US 2024/0114653 A1    Apr. 4, 2024

(51) Int. Cl.
*H05K 7/20* (2006.01)
*G06F 1/18* (2006.01)
*G06F 1/20* (2006.01)

(52) U.S. Cl.
CPC ......... *H05K 7/20272* (2013.01); *G06F 1/181* (2013.01); *G06F 1/182* (2013.01); *G06F 1/183* (2013.01); *G06F 1/20* (2013.01); *H05K 7/20154* (2013.01); *H05K 7/2039* (2013.01); *G06F 2200/1633* (2013.01); *G06F 2200/201* (2013.01); *H05K 7/20181* (2013.01)

(58) Field of Classification Search
CPC .......... H05K 7/20272; H05K 7/20154; H05K 7/2039; H05K 7/20181; G06F 1/181; G06F 1/182; G06F 1/183; G06F 1/20; G06F 2200/1633; G06F 2200/201
USPC ..................................................... 361/679.47
See application file for complete search history.

(56) References Cited

U.S. PATENT DOCUMENTS

| | | | | |
|---|---|---|---|---|
| 3,970,292 A | * | 7/1976 | Dachicourt | B60G 15/12 188/315 |
| 4,646,202 A | * | 2/1987 | Hook | H05K 11/02 361/689 |
| 4,659,070 A | * | 4/1987 | Buma | B60G 15/14 267/64.25 |
| 5,285,347 A | * | 2/1994 | Fox | G06F 1/20 257/714 |
| 5,297,005 A | * | 3/1994 | Gourdine | H05K 7/20154 361/695 |
| 5,718,628 A | * | 2/1998 | Nakazato | H05K 7/20745 236/49.5 |
| 5,808,866 A | * | 9/1998 | Porter | H05K 7/1424 174/544 |

(Continued)

*Primary Examiner* — Anatoly Vortman
(74) *Attorney, Agent, or Firm* — Brian C Jones

(57) ABSTRACT

In one embodiment, an enclosure device for a printed circuit board (PCB) comprises: an enclosure wall structure including therein a heater exchanger, a pipe to direct a cooling liquid through the heat exchanger, and a ducting to direct a gas through the heat exchanger to be cooled by the cooling liquid; and a PCB space adjacent to a portion of the enclosure wall structure for receiving the PCB. The ducting includes a downstream duct disposed downstream of the heat exchanger and extending through the portion of the enclosure wall structure adjacent to the PCB space to direct the cooled gas to the portion of the enclosure wall structure adjacent to the PCB space.

15 Claims, 13 Drawing Sheets

(56) References Cited

U.S. PATENT DOCUMENTS

| | | | | |
|---|---|---|---|---|
| 6,094,351 A * | 7/2000 | Kikinis | H05K 7/1438 | 361/728 |
| 6,115,252 A * | 9/2000 | Ohta | G06F 1/203 | 361/689 |
| 6,164,369 A * | 12/2000 | Stoller | H05K 7/20572 | 165/104.34 |
| 6,333,847 B1 * | 12/2001 | Katsui | G06F 1/203 | 361/679.55 |
| 6,374,627 B1 * | 4/2002 | Schumacher | G06F 1/20 | 62/263 |
| 6,412,292 B2 * | 7/2002 | Spinazzola | G06F 1/206 | 62/89 |
| 6,438,984 B1 * | 8/2002 | Novotny | H05K 7/20172 | 257/E23.098 |
| 6,494,050 B2 * | 12/2002 | Spinazzola | H05K 7/20745 | 62/89 |
| 6,574,104 B2 * | 6/2003 | Patel | H05K 7/20745 | 62/263 |
| 6,854,284 B2 * | 2/2005 | Bash | H05K 7/20836 | 236/49.3 |
| 6,967,842 B2 * | 11/2005 | Aoki | H05K 7/20772 | 165/80.4 |
| 7,012,807 B2 * | 3/2006 | Chu | G06F 1/20 | 165/80.4 |
| 7,170,745 B2 * | 1/2007 | Bash | G06F 1/206 | 361/695 |
| 7,203,063 B2 * | 4/2007 | Bash | H05K 7/20772 | 174/15.1 |
| 7,212,403 B2 * | 5/2007 | Rockenfell | G06F 1/20 | 361/679.52 |
| 7,405,930 B2 * | 7/2008 | Hongo | G06F 1/203 | 361/679.48 |
| 7,466,548 B2 * | 12/2008 | Ishikawa | H01L 23/4006 | 174/15.1 |
| 7,471,509 B1 * | 12/2008 | Oliver | G11B 25/043 | 361/728 |
| 7,471,513 B2 * | 12/2008 | Hayashi | G06F 1/20 | 361/695 |
| 7,641,028 B2 * | 1/2010 | Fox | F16F 9/0236 | 188/278 |
| 7,675,748 B2 * | 3/2010 | Matsushima | G11B 33/1426 | 361/699 |
| 7,813,121 B2 * | 10/2010 | Bisson | H05K 7/20736 | 361/679.53 |
| 7,878,889 B2 * | 2/2011 | Day | H05K 7/20745 | 454/184 |
| 7,898,805 B2 * | 3/2011 | MacDonald | G06F 1/203 | 361/679.48 |
| 8,184,436 B2 * | 5/2012 | Campbell | H05K 7/203 | 361/701 |
| 8,248,793 B2 * | 8/2012 | Bash | H05K 7/20781 | 361/679.48 |
| 8,713,956 B2 * | 5/2014 | Couto | G06F 1/1632 | 165/80.2 |
| 8,902,581 B2 * | 12/2014 | Goto | G06F 1/203 | 257/722 |
| 8,959,941 B2 * | 2/2015 | Campbell | H05K 7/20781 | 361/679.52 |
| 10,416,736 B2 * | 9/2019 | Dupont | H05K 7/20936 | |
| 11,687,133 B2 * | 6/2023 | Kulkarni | H05K 7/20145 | 361/679.46 |
| 2003/0042004 A1 * | 3/2003 | Novotny | H05K 7/20172 | 257/E23.098 |
| 2003/0067745 A1 * | 4/2003 | Patel | H05K 7/20745 | 361/690 |
| 2004/0250992 A1 * | 12/2004 | Aoki | H05K 7/20727 | 165/80.4 |
| 2005/0217828 A1 * | 10/2005 | Tomioka | G06F 1/203 | 165/104.31 |
| 2005/0243518 A1 * | 11/2005 | Hata | G06F 1/203 | 257/E23.098 |
| 2006/0162901 A1 * | 7/2006 | Aizono | H01L 23/473 | 257/E23.098 |
| 2007/0091567 A1 * | 4/2007 | Hayashi | G06F 1/20 | 361/695 |
| 2008/0101017 A1 * | 5/2008 | Hata | G06F 1/20 | 361/690 |
| 2008/0239638 A1 * | 10/2008 | Chinuki | F16M 11/42 | 361/679.07 |
| 2013/0271905 A1 * | 10/2013 | Sullivan | G06F 1/1607 | 361/679.02 |

\* cited by examiner

UNIVERSAL RUGGEDIZED COMPUTER SYSTEM ENCLOSURE

STATEMENT OF GOVERNMENT INTEREST

Under paragraph 1(a) of Executive Order 10096, the conditions under which this invention was made entitle the Government of the United States, as represented by the Secretary of the Army, to an undivided interest therein on any patent granted thereon by the United States. This and related patents are available for licensing to qualified licensees.

BACKGROUND

Field of the Invention

The present invention relates to enclosures for computers and, more specifically, universal ruggedized enclosures for portable computers including, for example, ATX (Advanced Technology extended) systems.

Description of the Related Art

This section introduces aspects that may help facilitate a better understanding of the invention. Accordingly, the statements of this section are to be read in this light and are not to be understood as admissions about what is prior art or what is not prior art.

Enclosures have been used for receiving and supporting motherboards including, for example, ATX and NLX (New Low-profile extended) motherboards. One example is disclosed in U.S. Pat. No. 6,094,351 for UNIVERSAL ENCLOSURE FOR DIFFERENT TYPE MOTHER BOARDS, which is incorporated herein by reference in its entirety.

SUMMARY

The present invention was developed to improve the performance and functionality of an enclosure for housing a PCB (Printed Circuit Board) of a computer. An onboard computer needs to meet requirements for both performance and ruggedization in a variety of applications including, for instance, unmanned ground vehicle robotics. A main problem is that the highest performance computers which can handle heavy software development are meant to sit idle in a desktop environment. COTS ruggedized computers do not meet hardware compute performance requirements for heavy software development, especially with constantly evolving technology in both the hardware and software space. In addition, such rugged computers are often very cost ineffective, do not include the newest hardware available, and are effectively a black box which cannot be upgraded or modified to meet changing hardware requirements.

Research and development have led to a novel universal ruggedized system enclosure that can be used to integrate a high performance non-ruggedized computer and expansion accessories in a rugged environment. One unique problem is that computer components can be outdated within a year or two of being released. A ruggedized computer built with specific components may become "old technology" by the time it is actually out for production in the field. While there are COTS ruggedized computers, they cannot be fitted with new motherboards or PCIe (Peripheral Component Interconnect Express) expansion cards. Although one may be able to swap the CPU or GPU, such PCU or GPU may have higher requirements for cooling in situations where one cannot actually utilize them in the existing infrastructure.

There are known ways to better ruggedize a desktop style computer such as a sealed pelican case but there are many disadvantages. One obvious disadvantage is that the form factor is quite large compared to a purpose-built ruggedized computer. In addition, they are often sealed from the environment such that while one can water cool some components of the computer, the motherboard still relies on ambient air movement for cooling. In such a case, the air circulating will become increasingly warmer. There are some existing solutions which utilize an air conditioning unit or peltier device for cooling the air inside the case. One drawback here is that the A/C unit requires a lot of space and power and is expensive, the peltier devices used in some cases require a lot of power because they are trying to cool an unnecessarily large space, and the air will not be conditioned to remove moisture which can kill a motherboard in extreme scenarios. With both of these existing solutions, passive water cooling is still needed on several components of the computer. The other drawback of this pelican case is that there is usually very limited shock dampening, so in the case where it is mounted onboard a ground platform which may experience very uneven terrain the components inside of the computer will eventually loosen or break resulting in failure as they were not assembled to see this kind of shock and vibration. Another drawback in integrating a desktop computer on a ground platform is that a large inverter is required to power the computer which already has a built in power supply. The inverter takes valuable space and power delivery is inefficient as it is likely converted from DC to AC back to DC and additional noise is added to the system. In sum, COTS ruggedized computers often do not have enough compute power, are expensive, are not modular to expansion or updates, and often utilize custom motherboards which lead to difficulty in software development. Existing methods to ruggedize existing desktop style computers is space inefficient, power inefficient, and are not known to be able to withstand severely rugged or harsh environments and operation.

Embodiments of the present invention provide a universal ruggedized PCB system enclosure as a solution to ruggedizing a common COTS desktop computer in a compact, easily integrated format. It is composed of a number of components including but not limited to integrated water cooling, a heat exchanger for cooling the ambient circulating air, a positive pressure system which filters particulates and removes moisture from outside air while also providing ingress protection via a constant pressure inside the system, a unique mounting method for PCIE expansion cards for reduced form factor, and protection from shock and vibration. In addition, the enclosure is supported by an adjustable air suspension for extreme shock and vibration protection which can be adjusted based on the contents of the enclosure and the environment of operation.

The system enclosure has one or more of the following features: a universal system enclosure that allows one to take a COTS motherboard and immediately ruggedize, an adjustable suspension for adaptation to differing environments and varying payloads, an inner core that allows for customization of accessories, a unique mounting method for expansion hardware that allows for reduced form factor and enhanced structural integrity, hollow chambers built in the wall for storage of cooling fluid so as to provide insulation and EMI shielding, coolant filled chambers that greatly reduce the form factor by eliminating the need for an external reservoir, integration of a positive pressure and environmental control system, and directed ambient air circulation system with integrated water cooled heat exchanger for heat removal.

The system enclosure may be a universal ruggedized ATX system enclosure. It is a self-contained compact computer enclosure that is universal to housing any ATX style motherboard. The system is sealed from the environment while still providing the necessary features to properly cool and protect the computer and peripherals needed.

An aspect of the present invention is directed to an enclosure device for a printed circuit board (PCB). The enclosure device comprises: an enclosure wall structure including therein a heater exchanger, a pipe to direct a cooling liquid through the heat exchanger, and a ducting to direct a gas through the heat exchanger to be cooled by the cooling liquid; and a PCB space adjacent to a portion of the enclosure wall structure for receiving the PCB. The ducting includes a downstream duct disposed downstream of the heat exchanger and extending through the portion of the enclosure wall structure adjacent to the PCB space to direct the cooled gas to the portion of the enclosure wall structure adjacent to the PCB space.

In some embodiments, a shelf is disposed inside the enclosure device and includes a graphics processing unit (GPU) shelf space for receiving a GPU, the downstream duct of the ducting extending through a portion of the enclosure wall structure adjacent to the GPU shelf space to direct the cooled gas to the portion of the enclosure wall structure adjacent to the GPU shelf space. The shelf may include an expansion card shelf space for receiving one or more expansion cards, the downstream duct of the ducting extending through a portion of the enclosure wall structure adjacent to the expansion card shelf space to direct the cooled gas to the portion of the enclosure wall structure adjacent to the expansion card shelf space. The shelf may include a power supply shelf space for receiving a power supply, the downstream duct of the ducting extending through a portion of the enclosure wall structure adjacent to the power supply shelf space to direct the cooled gas to the portion of the enclosure wall structure adjacent to the power supply shelf space.

In specific embodiments, a positive pressure system is disposed inside the enclosure device to produce a positive pressure inside the enclosure device. The positive pressure system may comprise: a peltier device including a cold side heat sink and a hot ide heat sink; a compressor to pull air from inside the enclosure device, compress the air, and push the compressed air across the cold side heat sink; at least one fan to direct air to cool the hot side heat sink; an air filter; and a valve which is openable to allow the compressor to pull air from outside the enclosure through the valve and the air filter.

In some embodiments, at least three (e.g., four) air cylinders are connected to at least three (e.g., four) corresponding exterior locations of the enclosure device. The at least three air cylinders are adjustable to provide independent air suspension to the enclosure device at the at least three corresponding exterior locations.

In accordance with another aspect, an enclosure device for a printed circuit board (PCB) comprises: an enclosure wall structure including therein a heater exchanger, a pipe to direct a cooling liquid through the heat exchanger, and a ducting to direct a gas through the heat exchanger to be cooled by the cooling liquid, the ducting including a downstream duct disposed downstream of the heat exchanger and extending through portions of the enclosure wall structure to direct the cooled gas to the portions of the enclosure wall structure; and a shelf disposed inside the enclosure device and including a plurality of shelf spaces to receive electronic components and position the electronic components adjacent to the portions of the enclosure wall structure to be cooled by the cooled gas flowing through the portions of the enclosure wall structure.

In accordance with another aspect, an enclosure device for a printed circuit board (PCB) comprises: an enclosure wall structure including therein a ducting to direct a cooled gas through portions of the enclosure wall structure; a PCB space adjacent to a portion of the portions of the enclosure wall structure through which the cooled gas is directed by the ducting for receiving the PCB; and a positive pressure system disposed inside the enclosure device to produce a positive pressure inside the enclosure device.

In some embodiment, a shelf is disposed inside the enclosure device and includes a plurality of shelf spaces for receiving electronic components and positioning the electronic components adjacent to the portions of the enclosure wall structure through which the cooled gas is directed by the ducting. The shelf may include one or more of: a graphics processing unit (GPU) shelf space for receiving a GPU; an expansion card shelf space for receiving one or more expansion cards; or a power supply shelf space for receiving a power supply.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Embodiments of the present invention provide a universal ruggedized PCB system enclosure as a solution to ruggedizing a common COTS desktop computer in a compact, easily integrated format. It is composed of a number of components including but not limited to integrated water cooling, a heat exchanger for cooling the ambient circulating air, a positive pressure system which filters particulates and removes moisture from outside air while also providing ingress protection via a constant pressure inside the system, a unique mounting method for PCIE expansion cards for reduced form factor, and protection from shock and vibration. In addition, the enclosure is supported by an adjustable air suspension for extreme shock and vibration protection which can be adjusted based on the contents of the enclosure and the environment of operation.

A specific embodiment of the system enclosure is a universal ruggedized ATX system enclosure. It is a self-contained compact computer enclosure that is universal to housing any ATX style motherboard. The system is sealed from the environment while still providing the necessary features to properly cool and protect the computer and peripherals needed.

Figure 1:
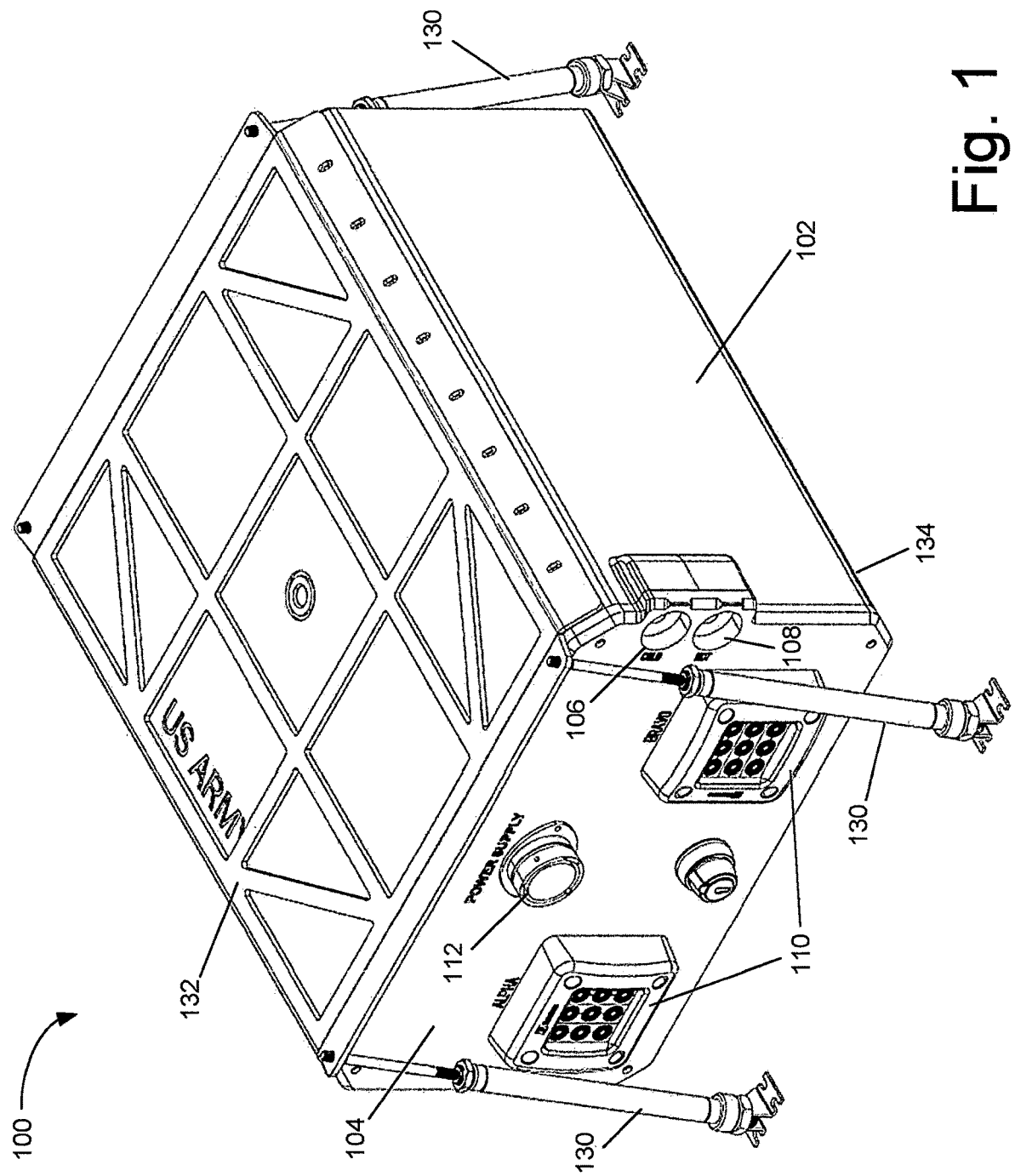
FIG. 1 is a perspective view of an enclosure 100 for a computer system including a printed circuit board (PCB) according to an embodiment of the present invention.

FIG. 1 is a perspective view of an enclosure 100 for a computer system including a printed circuit board (PCB) according to an embodiment of the present invention. The enclosure 100 has an enclosure wall structure 102 (e.g., front, back, top, and bottom walls) and side panels 104 (right and left) that form a nearly completely sealed system to provide ingress protection of the computer or electronic components inside from objects, water, dust, and accidental contact. The enclosure 100 includes a liquid or water inlet 106 and a liquid or water outlet 108 for flowing a liquid such as water in and out of the enclosure 100 for cooling.

Modular cable glands 110 protruding through the side wall of the enclosure wall structure 102 allow quick cable entry into the computer system inside the enclosure 100 while still providing ingress protection.

An integrated IP rated power bulkhead connector 112 protruding through the side panel 104 is able to accept DC power from a vehicle or other source. This power is sent to the ATX power supply or the like and other components in the system requiring power, including but not limited to, for example, an environmental control unit and various fans.

An adjustable air ride suspension setup provides an air cushion for the computer system. The suspension setup may include a plurality of air cylinders. The embodiment shown in FIG. 1 has four air cylinders 130 connected between four corners of the enclosure and a portable case or the like. In other embodiments, three or more (at least three) air cylinders may be used. The enclosure 100 may include an upper panel 132 and a bottom panel 134. The air cylinders 130 are connected to four corners of the upper panel 132 in the embodiment shown. The air cylinders 130 are each adjustable independently and easily. The air cylinder pressure can be adjusted on each corner or simultaneously to provide the proper support depending on the mass of the system and the terrain in which operation is to be performed. For example, if multiple GPUs (Graphs Processing Units) were added to the computer, then the system pressure could be boosted to support the additional mass. If the system were going to experience harsh bumps, the pressure could be boosted to better absorb the sudden shock. If only mild on-road conditions were to be experienced, then the pressure could be reduced to better allow suspension travel during small vibrations.

Figure 2:
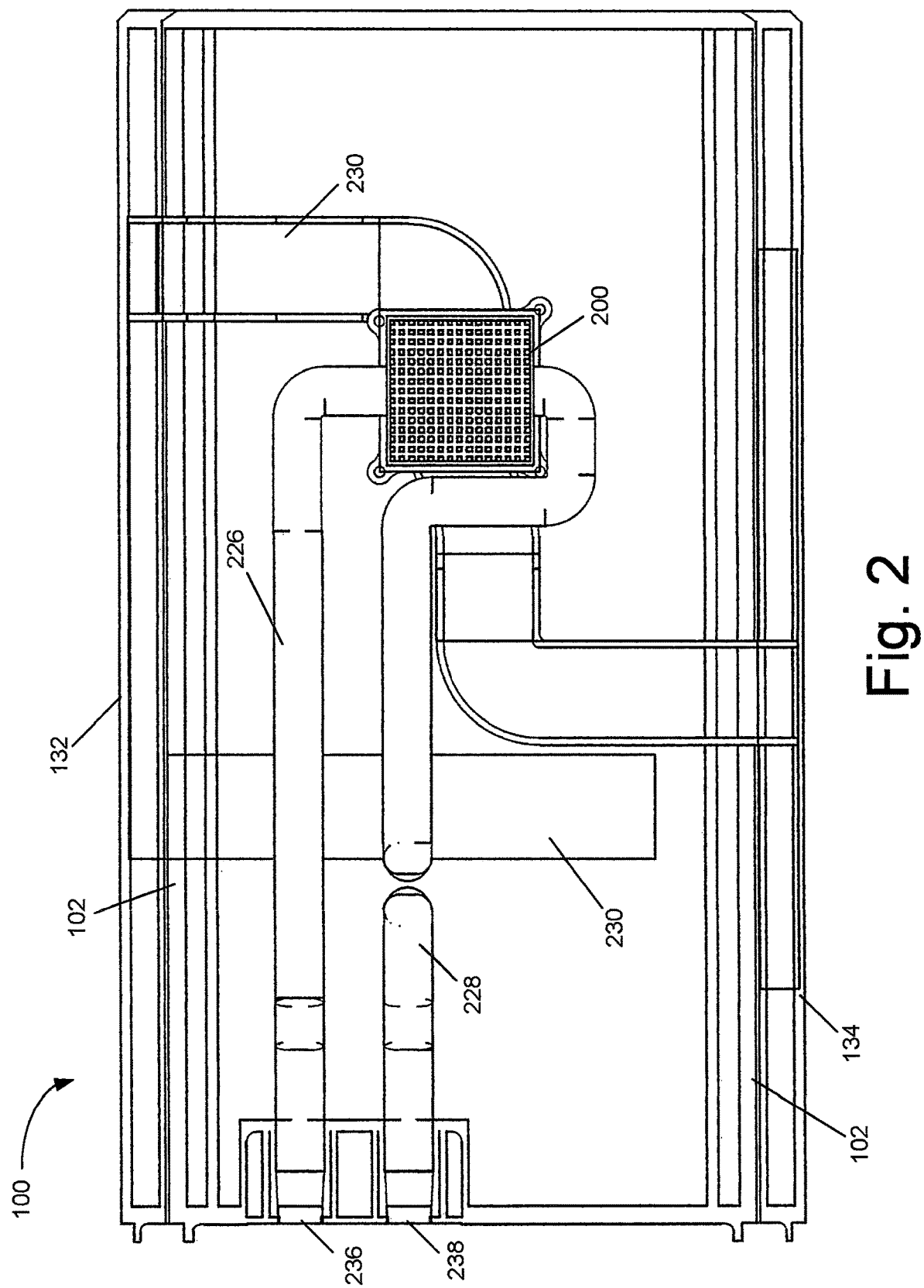
FIG. 2 is a sectional view of an interior of the enclosure of FIG. 1 showing internal ducting and plumbing which is at least partially built into the enclosure wall structure and the upper panel and the lower panel according to an embodiment.

FIG. 2 is a sectional view of an interior of the enclosure of FIG. 1 showing internal ducting and plumbing which is at least partially built into the enclosure wall structure 102 and the upper panel 132 and the lower panel 134 according to an embodiment.

Figure 3:
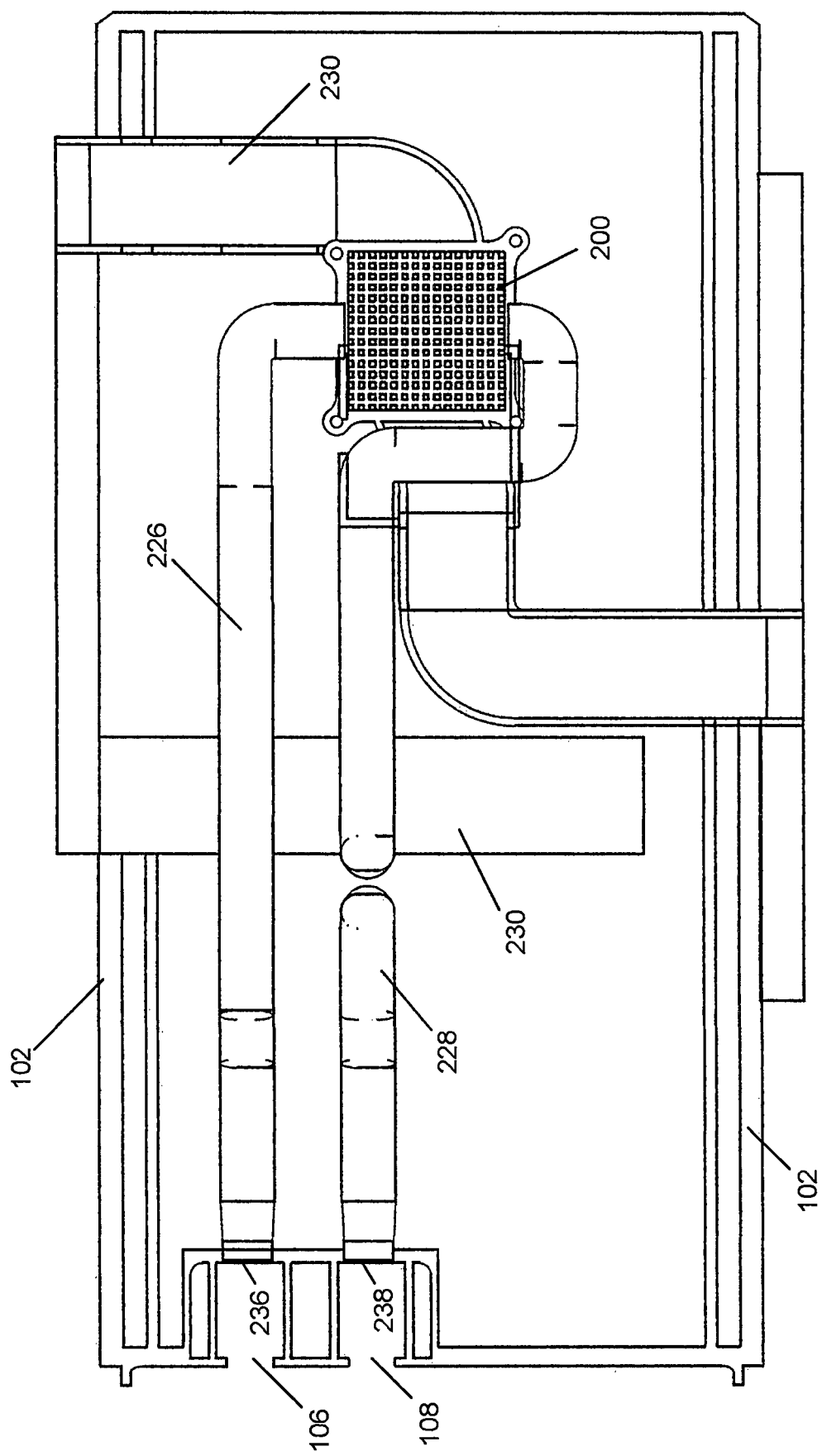
FIG. 3 is a sectional view of the interior of the enclosure of FIG. 1 showing internal ducting and plumbing without the upper panel and the lower panel according to another embodiment.

FIG. 3 is a sectional view of the interior of the enclosure of FIG. 1 showing internal ducting and plumbing without the upper panel 132 and the lower panel 134 according to another embodiment.

Figure 4:
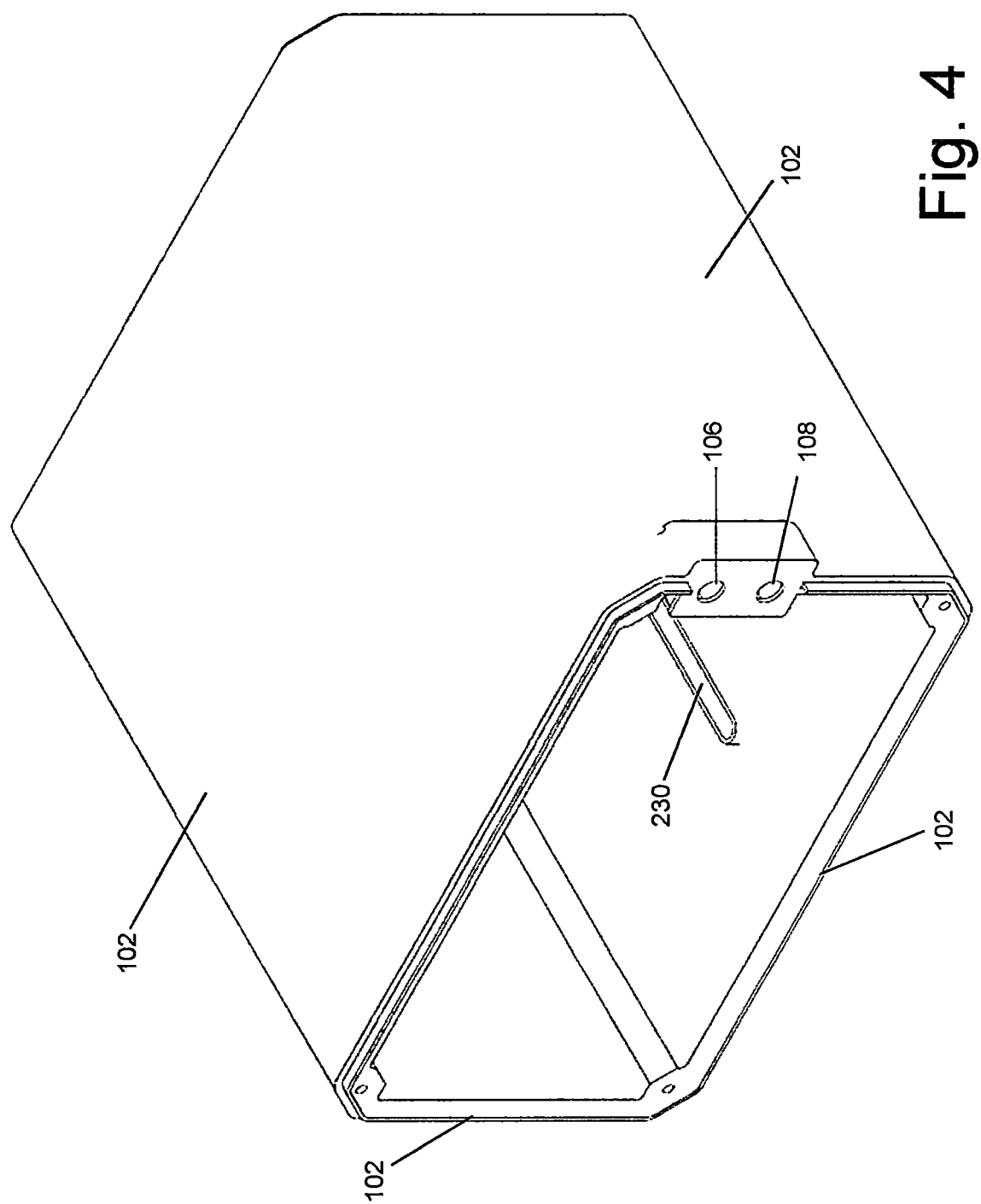
FIG. 4 is a perspective view of the enclosure of FIG. 1 illustrating the enclosure wall structure in which at least a portion of the internal ducting and plumbing is built according to an embodiment.

FIG. 4 is a perspective view of the enclosure 100 of FIG. 1 illustrating the enclosure wall structure 102 in which at least a portion of the internal ducting and plumbing is built according to an embodiment.

Figure 5:
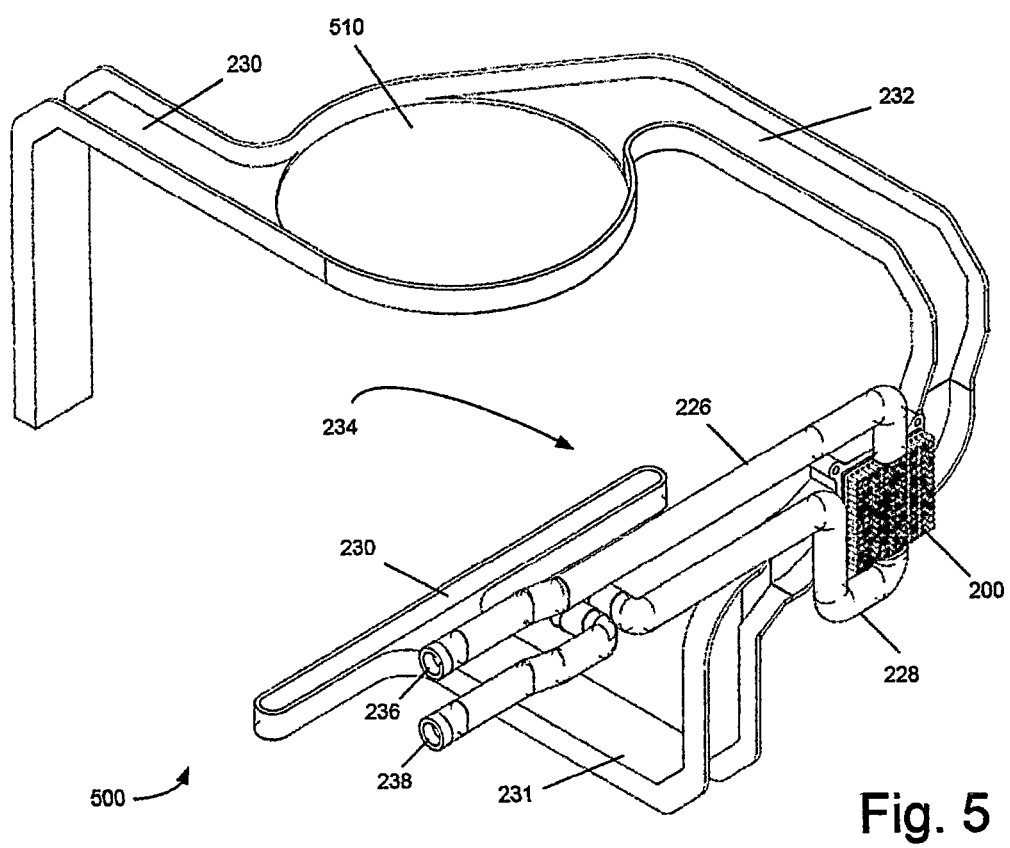
FIG. 5 is a perspective view of the internal ducting and plumbing which is at least partially built in the enclosure wall structure of FIG. 4.

FIG. 5 is a perspective view of the internal ducting and plumbing 500 which is at least partially built in the enclosure wall structure 102 of FIG. 4.

Figure 6:
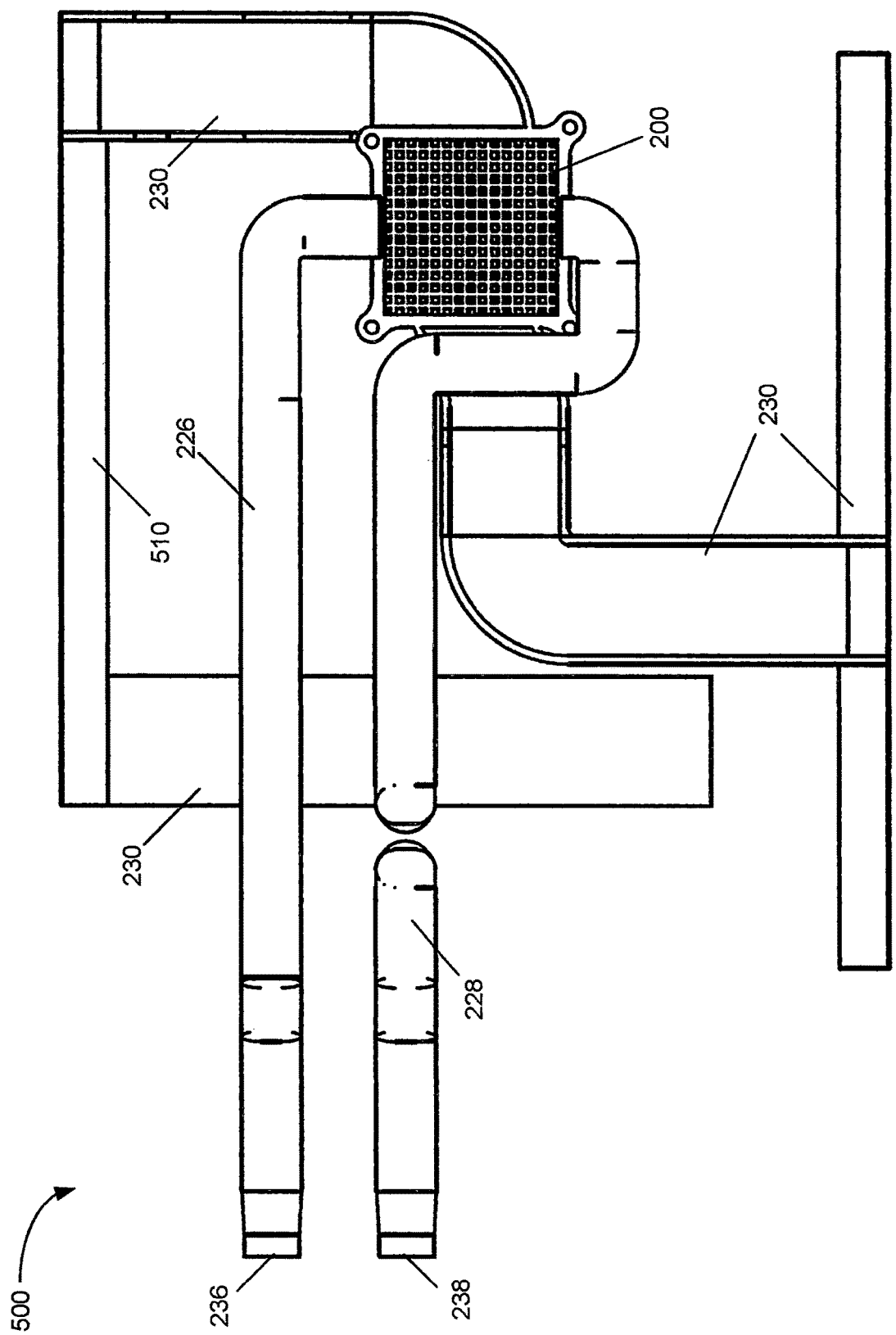
FIG. 6 is an interior sectional view of the internal ducting and plumbing of FIG. 5.

FIG. 6 is an interior sectional view of the internal ducting and plumbing of FIG. 5.

The system lends itself to easy integration and optimization of computer fluid cooling loops and direct air cooling. This is done with the features to be mentioned. Referring to FIGS. 2-6, a fluid reservoir built into the enclosure wall structure 102 of the enclosure 100 also provides additional thermal protection and EMI shielding.

An air-to-water heat exchanger 200 is used to cool the ambient air inside the enclosure 100. Air flows via one or more air ducts 230 through the heat exchanger 200 to be cooled by a liquid or water that flows through the heat exchanger 200 via liquid piping such as an inflowing pipe 226 with an inlet 236 and an outflowing pipe 228 with an outlet 238. Additional fluid manifolds may be built into the enclosure wall structure 102 with spill-free quick-disconnect ports (similar to inlet port 236 and outlet port 238) that provide easy hookup points for additional components or accessories to be fluid cooled.

Air ducting throughout the enclosure wall structure 102 of the enclosure 100 directs air across and underneath the motherboard. The air duct 230 includes an upstream duct portion 231 upstream of the heat exchanger 200 and a downstream duct portion 232 downstream of the heat-exchanger 200. As best seen in FIGS. 5 and 6, the air duct 230 extends (from the upstream duct portion 231) along the bottom enclosure wall underneath the motherboard in the motherboard space or CPU space 234 and along the front enclosure wall, the top enclosure wall, and the back enclosure wall. There may be additional outlets directing air from the top down onto the GPU, power supply and any other additional expansion cards or peripherals. One or more fans supply the air movement to the ducting throughout the sealed system. An example is a fan 510 shown in FIGS. 5 and 6.

The system lends itself to easy integration and optimization in rugged environments onboard off-road and on-road vehicles. This is done with the features described above.

Figure 7:
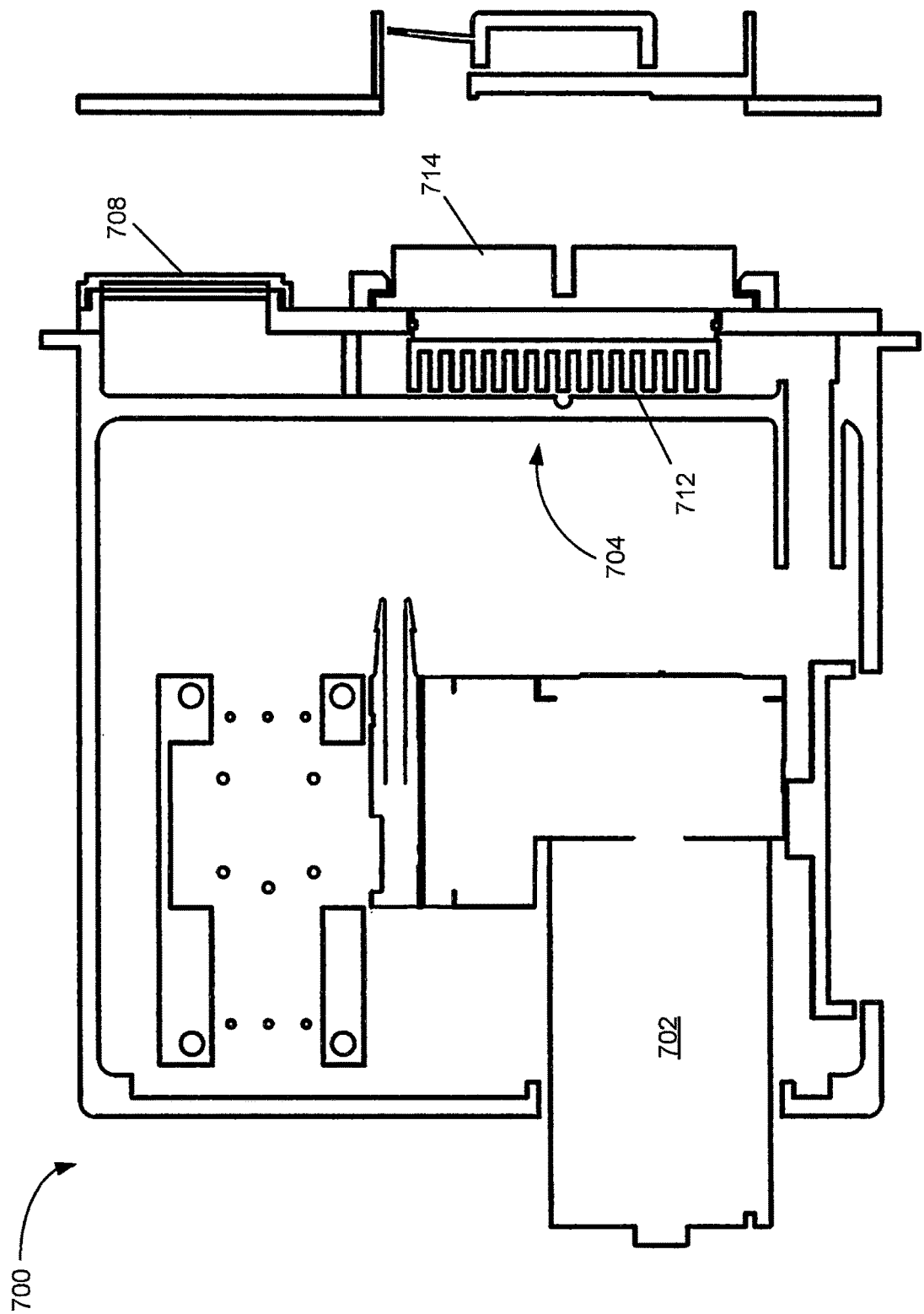
FIG. 7 is an interior sectional view of an interior of the enclosure of FIG. 1 illustrating components of a positive pressure system including a pump and a peltier device according to an embodiment.

FIG. 7 is an interior sectional view of an interior of the enclosure of FIG. 1 illustrating components of a positive pressure system 700 including a pump 702 and a peltier device 704 according to an embodiment.

Figure 8:
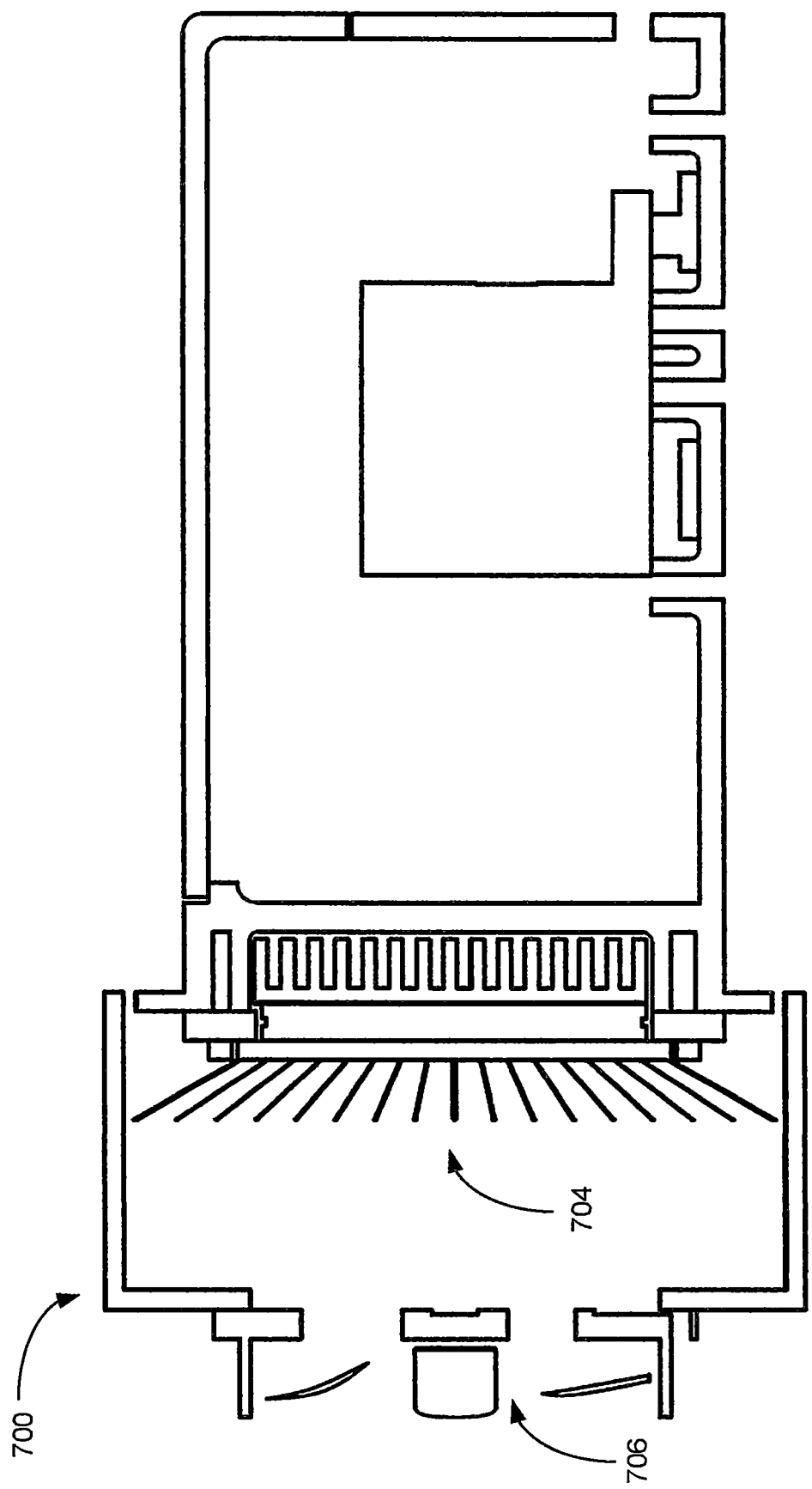
FIG. 8 is another sectional view of the interior of the enclosure of FIG. 1 illustrating the peltier device and the cooling fan thereof the positive pressure system of FIG. 7.

FIG. 8 is another sectional view of the interior of the enclosure of FIG. 1 illustrating the peltier device and the cooling fan thereof the positive pressure system of FIG. 7.

Figure 9:
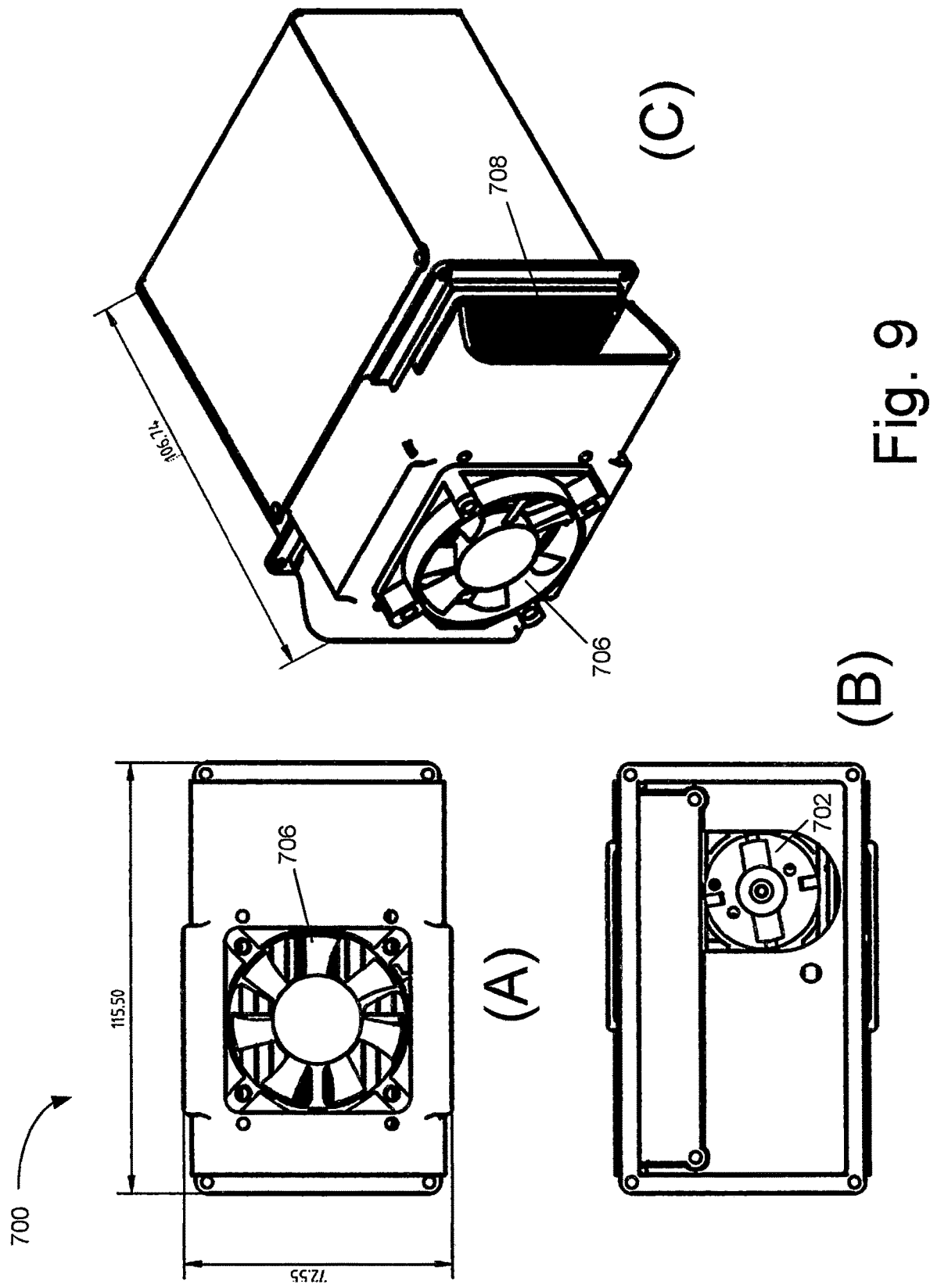
FIG. 9 illustrates the positive pressure system of FIG. 7 including (A) a left side view showing a cooling fan, (B) a right side view showing the pump, and (C) a perspective view showing an air filter and the cooling fan thereof.

FIG. 9 illustrates the positive pressure system of FIG. 7 including (A) a left side view showing a cooling fan, (B) a right side view showing the pump, and (C) a perspective view showing an air filter and the cooling fan thereof.

Figure 10:
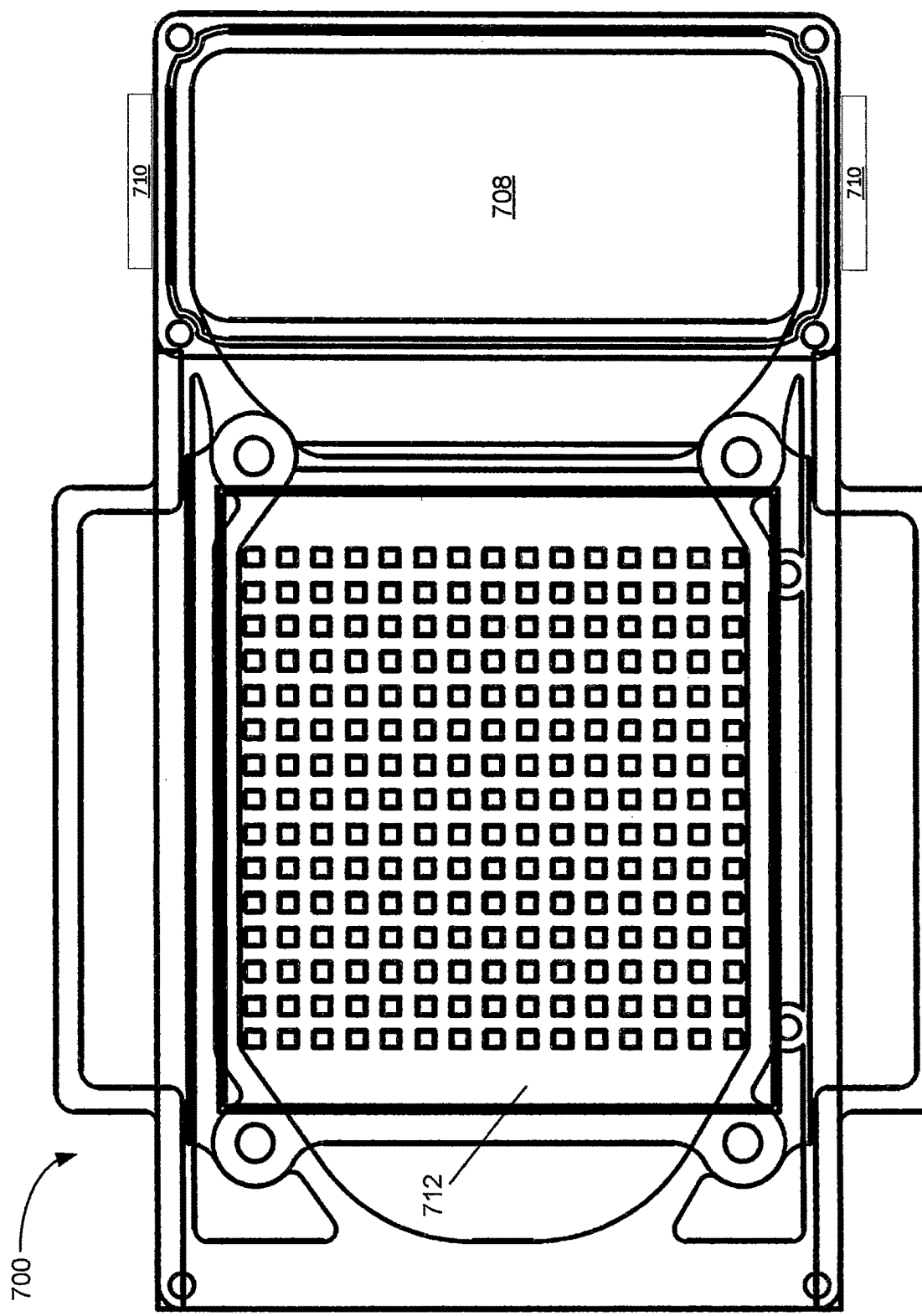
FIG. 10 is a side sectional view of the positive pressure system of FIG. 7 illustrating a heat sink and an air filter thereof.

FIG. 10 is a side sectional view of the positive pressure system of FIG. 7 illustrating a heat sink and an air filter thereof.

Referring to FIGS. 7-10, the positive pressure system 700 works in the enclosure 100 for the purpose of conditioning the air therein. The positive pressure system 700 can reduce humidity and thus temperature. It can also prevent introducing particulates into the system even while the enclosure is not 100% sealed from the outside environment. In the embodiment shown, the positive pressure system or subsystem 700 includes a small pump or compressor 702, a peltier device 704, one or more cooling fans 706, an air filter 708, a valve 710, and heat sinks 712, 714. The pump or compressor 702 pulls air from inside the enclosure 100 and subsequently pushes compressed air across the cold side of a peltier device 704. The peltier device 704 contains a heat sink 712, 714 on both the hot side and the cold side. The peltier device 704 removes moisture from the air passing over the cold side heat sink 712. The moisture is then drained outside the system 700. The hot side heat sink 714 expels heat outside the enclosure 100. The hot heat sinks 714 are additionally cooled with fans to improve the efficiency of the dehumidifying process. In addition, there are one or more valves 710 (see FIG. 10) which when opened allows the compressor 702 to pull filtered clean air from outside the enclosure 100. This would be advantageous when the ambient air inside the enclosure 100 becomes hotter than the ambient air outside. Lastly, the compressor 702 can produce a low pressure inside of the system while it is sealed. This is done to provide a positive pressure inside of the system which effectively prevents or reduces the ingress of dust, moisture, or other contaminants into the system. The system can be set to trip the peltier device 704 on and off when a specific humidity level is attained.

FIGS. 7-10 show another cooling feature that may also be set up to expel hot ambient air from inside the system when needed. This may be done with a built-in valve 710 that when opened will provide a passage for the fans (e.g., 706) to force the air out of the system. When this is done, clean outside air is also pulled through the filter 708 into the system.

Figure 11:
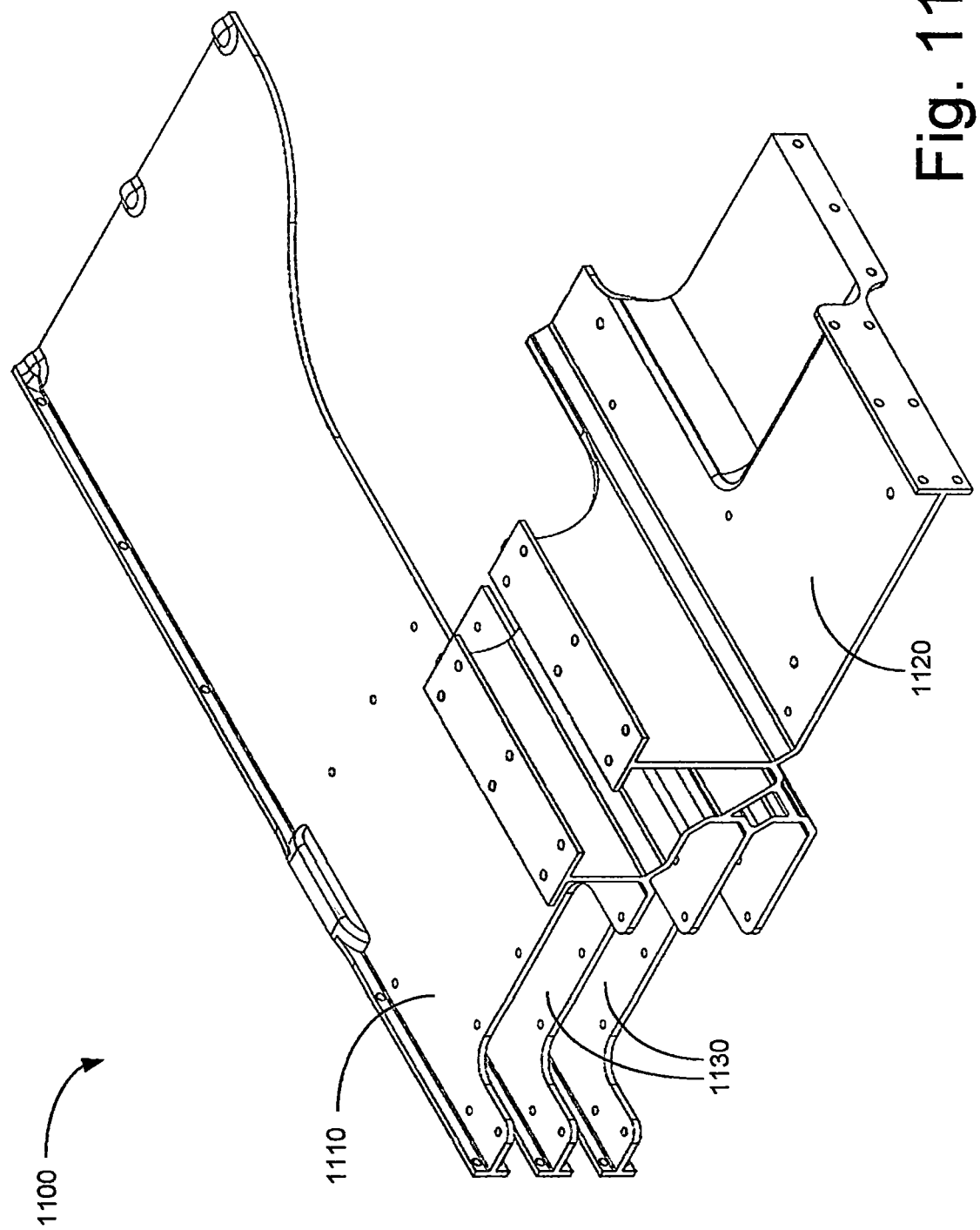
FIG. 11 is a perspective view of a shelf system for housing computer system components such as GPU or other expansion cars PCIe, power supply, and the like according to an embodiment.

FIG. 11 is a perspective view of a shelf system 1100 for housing computer system components such as GPU or other expansion cars PCIe, power supply, and the like according to an embodiment.

Figure 12:
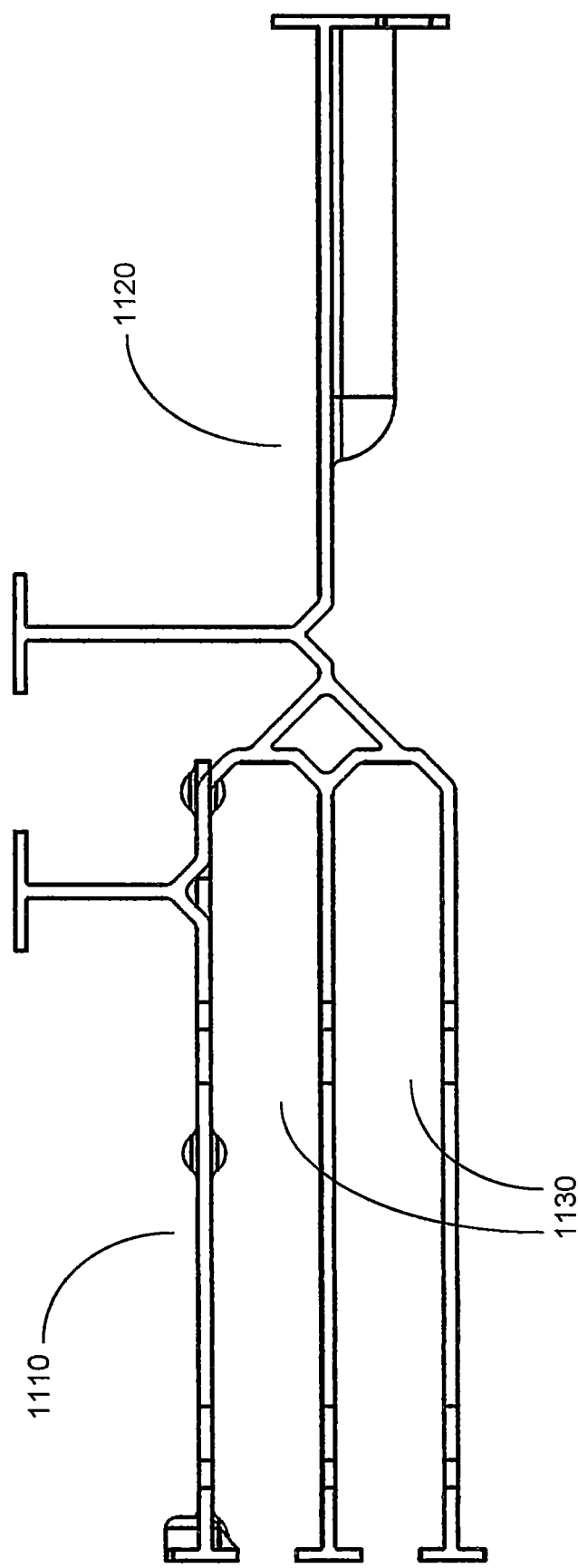
FIG. 12 is an elevational view of the shelf system of FIG. 11.

FIG. 12 is an elevational view of the shelf system 1100 of FIG. 11.

Figure 13:
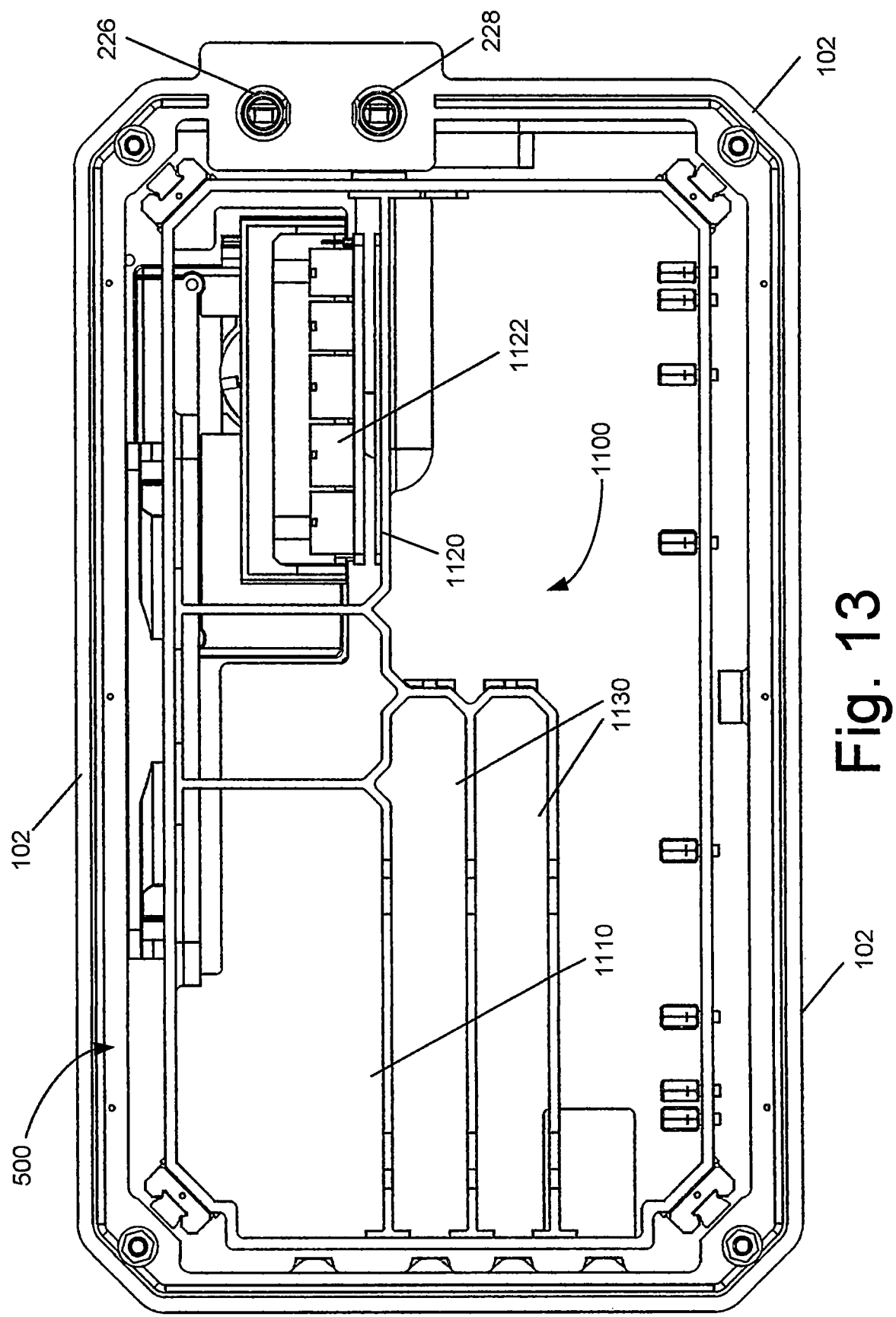
FIG. 13 shows the shelf system of FIG. 11 as installed inside the enclosure.

FIG. 13 shows the shelf system 1100 of FIG. 11 as installed inside the enclosure 100.

The shelf 1100 may be made of metal such as aluminum to provide a secure mounting location for a variety of computer or electronic components. One example is a full size GPU or other expansion cards that would otherwise be plugged in directly to a motherboard PCIe slot. In rough terrain these cards may otherwise break off or loosen themselves from the PCIe slots. The GPU may be placed in shelf space 1110. A DC-DC ATX power supply 1122 may be placed in shelf space 1120. PCIe expansion cards may be placed in shelves 1130.

In specific embodiments, the air ducting provides air ducts adjacent the shelf system 1100 to cool the GPU, other expansion cards, power supply, and the like. As shown in FIGS. 2-6 and described above, the air duct 230 extends along the bottom enclosure wall of the enclosure wall structure 102 underneath the motherboard space 234 for receiving the motherboard and along the front enclosure wall, the top enclosure wall, and the back enclosure wall. As best seen in FIG. 13, the GSU shelf space 1110 is disposed adjacent the top enclosure wall and upper portion of the back enclosure wall of the enclosure wall structure 102. The power supply shelf space 1120 is disposed adjacent the top enclosure wall and the front enclosure wall. The expansion card shelf is disposed adjacent the lower portion of the back enclosure wall. These electronic components may be disposed very close to the enclosure walls or in contact with the portions of the enclosure walls to be cooled by the cooling gas or air flowing through the portions of the enclosure walls.

The DC-DC ATX power supply mounting location may be on the power supply shelf space 1120. The power supply shelf space 1120 may also act as a large heat sink for the power supply and be placed under directed airflow (e.g., using a fan). This power supply eliminates the need for a large inverter onboard to power a standard AC-DC ATX power supply.

The system is more compact than a standard rack-mount computer case. This is advantageous for integrating into a smaller system or platform. As configured, the enclosure 100 requires about 10 to 35 percent less space than standard rackmount chassis capable of housing an ATX motherboard with a full size dedicated GPU and associated components.

Embodiments of the invention can be manifest in the form of methods and apparatuses for practicing those methods.

Unless explicitly stated otherwise, each numerical value and range should be interpreted as being approximate as if the word "about" or "approximately" preceded the value or range.

Unless otherwise indicated, all numbers expressing quantities of ingredients, properties such as molecular weight, percent, ratio, reaction conditions, and so forth used in the specification and claims are to be understood as being modified in all instances by the term "about," whether or not the term "about" is present. Accordingly, unless indicated to the contrary, the numerical parameters set forth in the specification and claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

All documents mentioned herein are hereby incorporated by reference in their entirety or alternatively to provide the disclosure for which they were specifically relied upon.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An enclosure device for a printed circuit board (PCB), the enclosure device comprising:
an enclosure wall structure including therein a heat exchanger, a pipe to direct a cooling liquid through the heat exchanger, and a ducting to direct a gas through the heat exchanger to be cooled by the cooling liquid; and
a PCB space adjacent to a portion of the enclosure wall structure for receiving the PCB;
the ducting including a downstream duct disposed downstream of the heat exchanger and extending through the portion of the enclosure wall structure adjacent to the PCB space to direct the cooled gas to the portion of the enclosure wall structure adjacent to the PCB space, a shelf disposed inside the enclosure device and including a graphics processing unit (GPU) shelf space for receiving a GPU, the downstream duct of the ducting extending through a portion of the enclosure wall structure adjacent to the GPU shelf space to direct the cooled gas to the portion of the enclosure wall structure adjacent to the GPU shelf space, wherein the positive pressure system comprises:
a peltier device including a cold side heat sink and a hot side heat sink;
a compressor to pull air from inside the enclosure device, compress the air, and push the compressed air across the cold side heat sink;
at least one fan to direct air to cool the hot side heat sink;
an air filter; and
a valve which is openable to allow the compressor to pull air from outside the enclosure through the valve and the air filter.

2. The enclosure device of claim 1, further comprising:
at least three air cylinders connected to at least three corresponding exterior locations of the enclosure device, the at least three air cylinders being adjustable to provide independent air suspension to the enclosure device at the at least three corresponding exterior locations.

3. The enclosure device of claim 1,
wherein a shelf disposed inside the enclosure device includes an expansion card shelf space for receiving one or more expansion cards, the downstream duct of the ducting extending through a portion of the enclosure wall structure adjacent to the expansion card shelf space to direct the cooled gas to the portion of the enclosure wall structure adjacent to the expansion card shelf space.

4. The enclosure device of claim 1,
wherein a shelf disposed inside the enclosure device includes a power supply shelf space for receiving a power supply, the downstream duct of the ducting extending through a portion of the enclosure wall structure adjacent to the power supply shelf space to direct the cooled gas to the portion of the enclosure wall structure adjacent to the power supply shelf space.

5. The enclosure device of claim 1, further comprising:
a positive pressure system disposed inside the enclosure device to produce a positive pressure inside the enclosure device.

6. An enclosure device for a printed circuit board (PCB), the enclosure device comprising:
an enclosure wall structure including therein a heat exchanger, a pipe to direct a cooling liquid through the heat exchanger, and a ducting to direct a gas through the heat exchanger to be cooled by the cooling liquid, the ducting including a downstream duct disposed downstream of the heat exchanger and extending through portions of the enclosure wall structure to direct the cooled gas to the portions of the enclosure wall structure; and a shelf disposed inside the enclosure device and including a plurality of shelf spaces to receive electronic components and position the electronic components adjacent to the portions of the enclosure wall structure to be cooled by the cooled gas flowing through the portions of the enclosure wall structure, a positive pressure system disposed inside the enclosure device to produce a positive pressure inside the enclosure device, wherein the positive pressure system comprises:

a peltier device including a cold side heat sink and a hot side heat sink;

a compressor to pull air from inside the enclosure device, compress the air, and push the compressed air across the cold side heat sink;

at least one fan to direct air to cool the hot side heat sink;

an air filter; and a valve which is openable to allow the compressor to pull air from outside the enclosure through the valve and the air filter.

7. The enclosure device of claim 6, further comprising:
at least three air cylinders connected to at least three corresponding exterior locations of the enclosure device, the at least three air cylinders being adjustable to provide independent air suspension to the enclosure device at the at least three corresponding exterior locations.

8. The enclosure device of claim 6,
wherein the shelf disposed inside the enclosure device includes a graphics processing unit (GPU) shelf space for receiving a GPU, the downstream duct of the ducting extending through a portion of the enclosure wall structure adjacent to the GPU shelf space to direct the cooled gas to the portion of the enclosure wall structure adjacent to the GPU shelf space; and
wherein the downstream duct extends through a bottom enclosure wall portion of the enclosure wall structure to provide a PCB space above the bottom enclosure wall portion for receiving the PCB.

9. The enclosure device of claim 6,
wherein the shelf disposed inside the enclosure device includes an expansion card shelf space for receiving one or more expansion cards, the downstream duct of the ducting extending through a portion of the enclosure wall structure adjacent to the expansion card shelf space to direct the cooled gas to the portion of the enclosure wall structure adjacent to the expansion card shelf space.

10. The enclosure device of claim 6,
wherein the shelf disposed inside the enclosure device includes a power supply shelf space for receiving a power supply, the downstream duct of the ducting extending through a portion of the enclosure wall structure adjacent to the power supply shelf space to direct the cooled gas to the portion of the enclosure wall structure adjacent to the power supply shelf space.

11. An enclosure device for a printed circuit board (PCB), the enclosure device comprising:
an enclosure wall structure including therein a ducting to direct a cooled gas through portions of the enclosure wall structure;
a PCB space adjacent to a portion of the enclosure wall structure through which the cooled gas is directed by the ducting for receiving the PCB; and
a positive pressure system disposed inside the enclosure device to produce a positive pressure inside the enclosure device wherein the positive pressure system comprises:
a peltier device including a cold side heat sink and a hot side heat sink;
a compressor to pull air from inside the enclosure device, compress the air, and push the compressed air across the cold side heat sink;
at least one fan to direct air to cool the hot side heat sink;
an air filter; and
a valve which is openable to allow the compressor to pull air from outside the enclosure through the valve and the air filter.

12. The enclosure device of claim 11, further comprising:
a shelf disposed inside the enclosure device and including a plurality of shelf spaces for receiving electronic components and positioning the electronic components adjacent to the portions of the enclosure wall structure through which the cooled gas is directed by the ducting.

13. The enclosure device of claim 12, wherein the shelf includes one or more of:
a graphics processing unit (GPU) shelf space for receiving a GPU;
an expansion card shelf space for receiving one or more expansion cards; or
a power supply shelf space for receiving a power supply.

14. The enclosure device of claim 11,
wherein the enclosure wall structure further includes therein a heat exchanger and a pipe to direct a cooling liquid through the heat exchanger; and
wherein the ducting is configured to direct a gas through the heat exchanger to be cooled by the cooling liquid, the ducting including a downstream duct disposed downstream of the heat exchanger and extending through portions of the enclosure wall structure to direct the cooled gas to the portions of the enclosure wall structure.

15. The enclosure device of claim 11, further comprising:
at least three air cylinders connected to at least three corresponding exterior locations of the enclosure device, the at least three air cylinders being adjustable to provide independent air suspension to the enclosure device at the at least three corresponding exterior locations.

* * * * *